(12) United States Patent
Kim et al.

(10) Patent No.: US 8,488,329 B2
(45) Date of Patent: Jul. 16, 2013

(54) POWER AND GROUND VIAS FOR POWER DISTRIBUTION SYSTEMS

(75) Inventors: Tae H. Kim, Round Rock, TX (US); Sang Y. Lee, Austin, TX (US); Nam H. Pham, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 383 days.

(21) Appl. No.: 12/776,888

(22) Filed: May 10, 2010

(65) Prior Publication Data

US 2011/0273855 A1    Nov. 10, 2011

(51) Int. Cl.
*H05K 7/00* (2006.01)
*H05K 1/11* (2006.01)

(52) U.S. Cl.
CPC ..................................... *H05K 1/115* (2013.01)
USPC ........................................... 361/760; 361/764

(58) Field of Classification Search
CPC ................. H05K 1/0265; H05K 1/115; H05K 2201/09854
USPC ................. 174/255, 262, 259, 260; 29/846, 29/852; 361/792–795, 790, 760, 764
See application file for complete search history.

(56) References Cited

U.S. PATENT DOCUMENTS

| | | | |
|---|---|---|---|
| 5,414,222 A | 5/1995 | Sen et al. | |
| 6,037,547 A | 3/2000 | Blish, II | |
| 6,198,362 B1 * | 3/2001 | Harada et al. | 333/12 |
| 6,667,443 B2 * | 12/2003 | Kondo et al. | 174/255 |
| 6,713,685 B1 | 3/2004 | Cotton | |
| 7,291,795 B2 | 11/2007 | Maharshak et al. | |
| 7,326,061 B2 * | 2/2008 | Zhang | 439/55 |
| 7,427,718 B2 * | 9/2008 | Ng et al. | 174/255 |
| 7,645,942 B2 | 1/2010 | Schmachtenberg, III et al. | |
| 2007/0107933 A1 * | 5/2007 | Yamamoto et al. | 174/262 |
| 2008/0308303 A1 | 12/2008 | Lehmann et al. | |

FOREIGN PATENT DOCUMENTS

| | | |
|---|---|---|
| EP | 1127387 A | 10/2007 |
| JP | 5016008 A | 1/1993 |
| JP | 11214822 A | 8/1999 |
| JP | 2002-120196 A | 4/2002 |

* cited by examiner

*Primary Examiner* — Yuriy Semenenko
(74) *Attorney, Agent, or Firm* — Olive Law Group, PLLC; Thomas E. Tyson

(57) ABSTRACT

A system for providing power and ground vias for power distributions systems includes first and second conductive layers on a microelectronic package. The conductive layers may include one or more conductive components such as, but not limited to, power planes, ground planes, pads, traces, and the like for electrically connecting to electronic components. A via may electrically connect the first and second conductive layers. The via may have a cross-section of at least three partially-overlapping shapes. Each of the shapes partially overlaps at least two of the other shapes. The shapes may be, for example, circular, triangular, rectangular, square, polygonal, rhomboidal shape, or any other shape.

10 Claims, 4 Drawing Sheets

POWER AND GROUND VIAS FOR POWER DISTRIBUTION SYSTEMS

BACKGROUND

1. Field of the Invention

The present invention relates to power distribution systems in microelectronic packages, and more specifically, to power and ground vias for power distribution systems in microelectronic packages.

2. Description of Related Art

In many modern electronic systems, printed circuit boards and various other microelectronic packages are used to connect electronic components together for communication. A printed circuit board is typically a flat panel that interconnects electronic components using a pattern of flat conductive pathways, often referred to as traces, which are formed on a non-conductive substrate. A printed circuit board may contain conductive pathway patterns on the top and bottom surfaces of the printed circuit board or in layers within the interior of the printed circuit board. Conductive pathways on different layers of a printed circuit board may be electrically connected through vias. Vias are conductive pathways that may plate the walls of holes extending through the layers of the printed circuit board.

A single printed circuit board typically includes a power distribution system for distributing power to one or more electrical components connected to the printed circuit board. The power distribution system may include a power source and conductive pathways electrically connecting the power source and the electrical components. A conductive pathway may include one or more traces, vias, or combinations thereof connected together for allowing the power source to provide power to the electronic components using electronic conduction.

In high-speed microelectronic package design, an efficient power distribution system is critical in achieving desired performance. As system frequency increases and the signal rise time reduces, an inefficient power delivery network may lose power through the power plane, and thereby deliver inadequate power supply voltage to the electronic components such that system performance is lowered or the system fails. The power distribution system must provide sufficient current for meeting high peak current requirements during output switching. This current requirement must be met while also maintaining the input supply voltage needed by electronic components.

To meet the power demands of electronic components, discrete capacitors are often utilized. These capacitors may be connected between power and ground planes to provide the necessary charge current to the electronic components. For example, these capacitors discharge their current into the electronic component and quickly recharge from energy stored in slower discharging capacitors and power supplies prior to the next required discharge as needed by the electronic component. Although the provision of power and ground planes has been beneficial, there is a need for improved methods for delivering power and signals to electronic components on a microelectronic package.

BRIEF SUMMARY

One or more embodiments of the present invention provide a system for providing power and ground vias for power distributions systems. The system includes first and second conductive layers on a microelectronic package such as, but not limited to, a multilayer printed circuit board. The conductive layers may include one or more conductive components, such as, but not limited to, power planes, ground planes, pads, traces, and the like for electrically connecting to electronic components. A via may electrically connect the first and second conductive layers. The via may have a cross-section of at least three partially-overlapping shapes. Each of the shapes partially overlaps at least two of the other shapes. The shapes may be, for example, circular, triangular, rectangular, square, polygonal, rhomboidal shape, or any other shape.

One or more embodiments of the present invention provide a method for providing power and ground vias for power distribution systems. The method includes providing first and second conductive layers on a microelectronic package. The method includes forming a via electrically connecting the first and second conductive layers. The via has a cross-section of at least three partially-overlapping shapes. Each of the shapes partially overlaps at least two of the other shapes. One of the conductive layers may include a power plane or ground plane that is electrically connected to the via.

DETAILED DESCRIPTION

Exemplary power and ground vias and associated methods for power distribution systems in accordance with embodiments of the present invention are described herein. Particularly, described herein are exemplary via structure shapes for improving the delivery of power and signals to electronic components on microelectronic packages such as, but not limited to, printed circuit boards. Via structure shapes in accordance with embodiments of the present invention can improve the efficiency of power delivery by power distribution systems to microelectronic components in a microelectronic package.

Via structure shapes in accordance with embodiments of the present invention can be used to improve power delivery systems. Particularly, via structure shapes as described herein provide power delivery systems having vias, power planes, and ground planes with lowered resistance. This is achieved because the vias have a shape with increased surface area of the via as well as reduced cross-sectional area, which allows power and ground planes to have increased surface areas. As a result, resistances at the vias and the power and ground planes are reduced, thereby reducing loss of power in the power delivery system.

In addition, by using via structure shapes in accordance with embodiments of the present invention to increase surface areas of the power and ground planes, signal integrity in power distribution systems may be improved. This is because an increase in the surface areas of the power and ground planes results in an increase in the capacitance in the power and ground planes, which enables better signal integrity.

It will be recognized by those skilled in the art that the vias described herein may be used for electrically connecting between conductive components that are part of different conductive layers in any type of microelectronic package. A conductive layer may be one of a plurality of conductive layers in a microelectronic package, and may include one or more conductive components, such as, but not limited to, traces, pads, and the like. In the examples described herein, the vias electrically connect a power or ground plane in one layer to a conductive component in another layer. However, it should be noted that vias described herein are not limited to electrically connecting power and ground planes, but the vias may also be used for electrically connecting any type of conductive components between layers of a microelectronic package.

Figure 1:
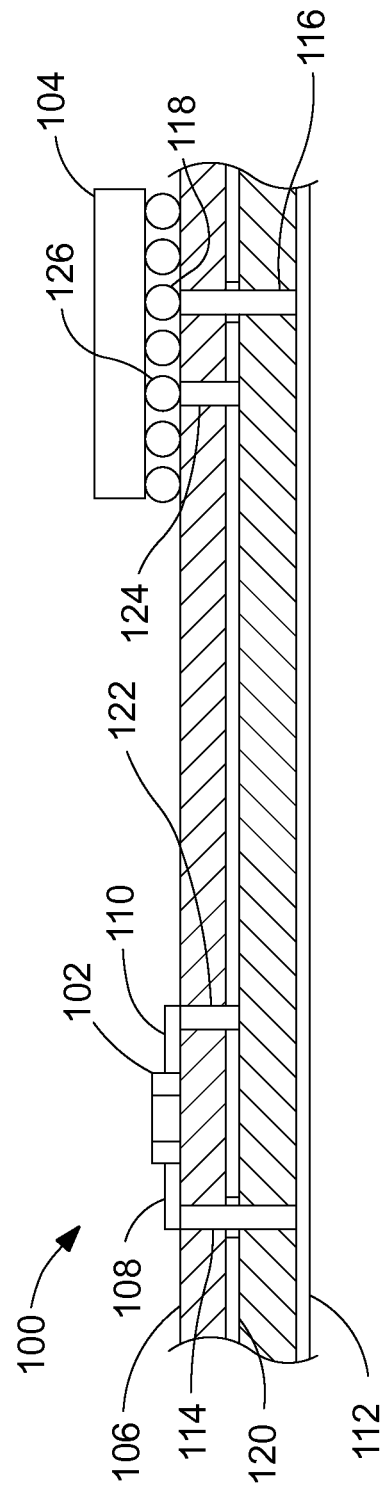
FIG. 1 sets forth a cross-sectional side view of a power distribution system having vias in accordance with embodiments of the present invention.

FIG. 1 illustrates a cross-sectional side view of a power distribution system 100 having vias in accordance with embodiments of the present invention. Referring to FIG. 1, the system 100 includes a power source 102 for providing power to an electrical component 104. The power source 102 and the electrical component 104 may be suitably mounted on a printed circuit board (PCB) 106 as understood by those of skill in the art. The electrical component 104 may be one of a plurality of electrical components mounted on the PCB 106. The electrical component 104 may be, for example, but not limited to, an integrated circuit (e.g., an operational amplifier, resistor array, logic gate, and the like), a resistor, a capacitor, a transistor, a diode, and the like. The power source and electrical components may be mounted to the printed circuit board and connected at designated portions of a trace pattern, often referred to as pads or lands. The power source 102 and the electrical component 104 may be connected to the printed circuit board 106 using, for example, surface mount technology, through-hole mounting technology, or any other suitable technology as known to those skilled in the art. Surface mount technology connects electronic components to a printed circuit board by soldering electronic component leads or terminals to the top surface of the printed circuit board. Through-hole mount technology connects electronic components to a printed circuit board by inserting component leads through holes in the printed circuit board and then soldering the leads in place on the opposite side of the printed circuit board.

The system 100 may distribute power generated by the power source 102 to the electrical component 104 and any other electrically-connected components connected to the printed circuit board 106. Particularly, the power source 102 supplies a positive voltage ($V_{dd}$) and a ground (GND) at power supply voltage terminals 108 and 110, respectively. The system 100 may include a conductive layer 112 and vias 114 and 116 for electrically connecting the power supply voltage terminal 108 to a positive power terminal 118 of the electrical component 104. The system 100 may include a conductive layer 120 and vias 122 and 124 for electrically connecting the power supply ground terminal 110 to a ground terminal 126 of the electrical component 104. By these electrical connections between the power source 102 and the electrical component 104, the power source 102 may provide power to the electrical component 104. The positive power terminal 118 and the ground terminal 126 of the electrical component 104 may be connected to the vias 116 and 124, respectively, by way of pads or other conductive components attached to the same or different conductive layer as the power supply voltage terminals 108 and 110.

Conductive layers 112 and 120 may include a power plane and a ground plane, respectively. However, it should be noted that these conductive layers are not limited as such, and these conductive layers may alternatively be any suitable electrically conductive pathway, such as a trace. The power and ground planes are spaced-apart conductive plates for serving as a capacitor. The power and ground planes may substantially cover an area of their respective planes of the PCB 106. The ground plane may include apertures through which vias 114 and 116 may extend without directly contacting the ground plane.

Figure 2:
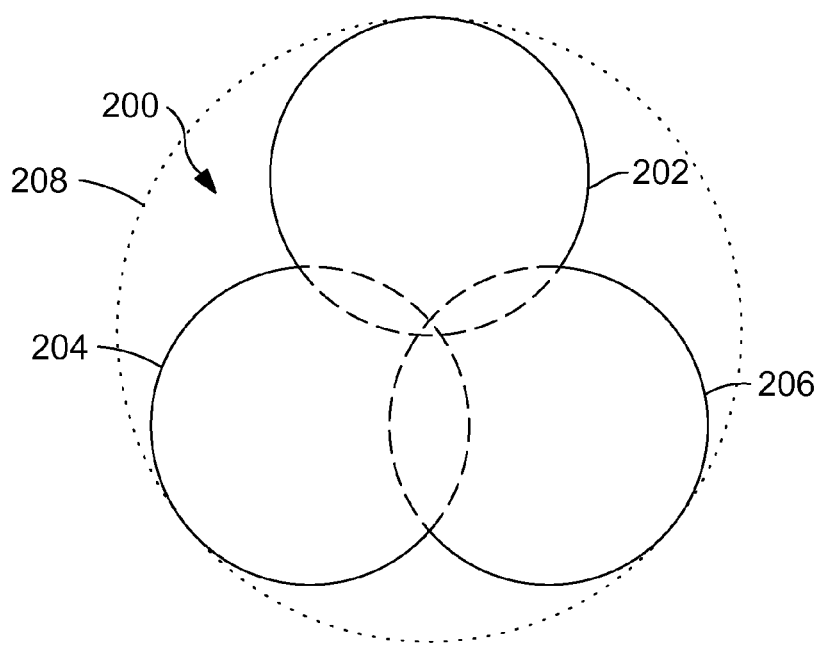
FIG. 2 sets forth a cross-sectional top view of an exemplary via with a cross-section having a shape of three partially-overlapping circular shapes in accordance with embodiments of the present invention.
Figure 3:
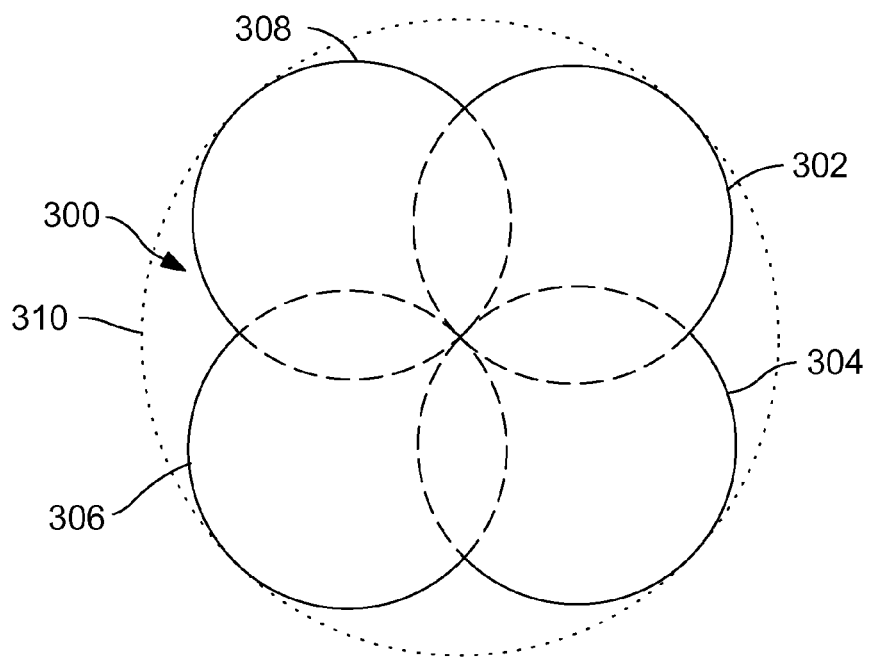
FIG. 3 sets forth a cross-sectional top view of an exemplary via with a cross-section having a shape of four partially-overlapping circular shapes in accordance with embodiments of the present invention.
Figure 4:
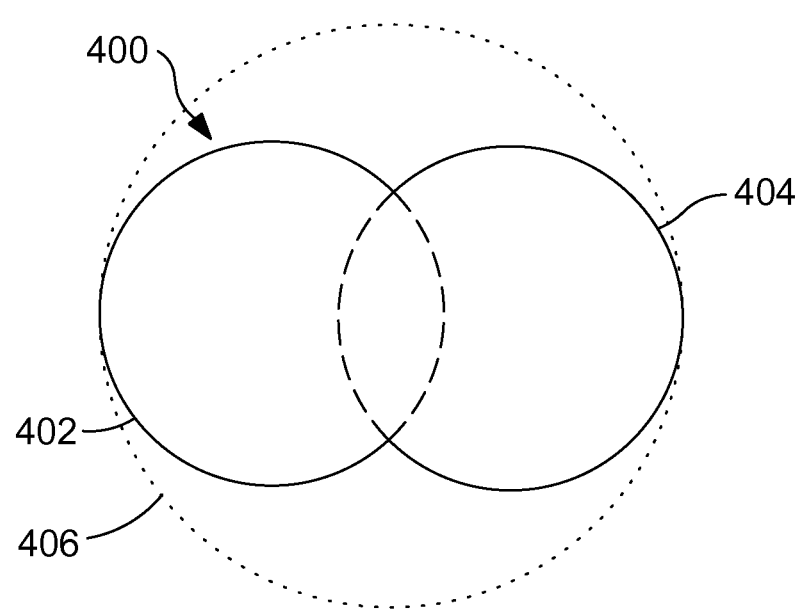
FIG. 4 sets forth a cross-sectional top view of an exemplary via with a cross-section having a shape of two partially-overlapping circular shapes in accordance with embodiments of the present invention.

FIGS. 2, 3, and 4 are various cross-sectional top views of exemplary vias according to embodiments of the present invention. Referring to FIG. 2, the cross-sectional shape of a via 200 is illustrated by the curved solid lines. The via 200 has a cross-sectional shape of three partially-overlapping circular shapes 202, 204, and 206. Only a portion of each of the circular shapes 202, 204, and 206 form the cross-sectional shape of the via 200 as indicated by the solid line portion of each circular shape. The broken lines of each shape 202, 204, and 206 are not part of the cross-sectional shape of the via 200, and are meant to show the other portion of each circular shape for illustrative purposes only.

Each of the circular shapes 202, 204, and 206 partially overlaps two of the other circular shapes, although the shapes may, for example, partially overlap more than two other shapes. For example, shape 202 partially overlaps shapes 204 and 206, shape 204 partially overlaps shapes 202 and 206, and shape 206 partially overlaps shapes 202 and 204. The circular shapes 202, 204, and 206 are each equal in size and may each be sized 10 mils in diameter. Alternatively, the circular shapes may have different sizes from each other. Further, in the alternative, the circular shapes may range in diameter between about 8 mils and about 18 mils. The shapes may be differently sized or shaped.

The cross-sectional area of the via 200 is less than the area of a single circle (where its perimeter is indicated by dotted line 208) having a diameter approximately equal to a major dimension of the via 200. The circle 208 represents the cross-sectional shape of a conventional drilled via. The diameter of each circular shape 202, 204, and 206 is about half the diameter of the circle 208. As compared to the area of the circle 208, the cross-sectional area of the via 200 is about 29% less than the cross-sectional area of the circle 208. In addition, the length of the perimeter of the shape of the via 200 is about 12.5% greater than the circumference of the circle 208. As a result of having reduced cross-sectional area compared to the conventional via-shaped circle 208, a power or ground plane electrically connected thereto may have a greater surface area, thereby reducing loss of power in the power delivery system. This via may provide about 22% less DC resistance ($R_{DC}$) in the power or ground plane, and may provide about 11% less DC resistance in the via. In addition, by allowing for the increased surface areas of the power and ground planes, signal integrity may be improved due to the increase in the capacitance in the power and ground planes.

Referring to FIG. 3, the cross-sectional shape of a via 300 is illustrated by the curved solid lines. The via 300 has a cross-sectional shape of four partially-overlapping circular shapes 302, 304, 306, and 308. Only a portion of each of the circular shapes 302, 304, 306, and 308 form the cross-sectional shape of the via 300 as indicated by the solid line of each circular shape. The broken lines of each shape 302, 304, 306, and 308 are not part of the cross-sectional shape of the via 300, and are meant to show the other portion of each circular shape for illustrative purposes only.

Each of the circular shapes 302, 304, 306, and 308 partially overlaps two of the other circular shapes, although the shapes may, for example, partially overlap more than two other shapes. For example, shape 302 partially overlaps shapes 304 and 308, shape 304 partially overlaps shapes 302 and 306, shape 306 partially overlaps shapes 304 and 306, and shape 308 partially overlaps shapes 302 and 306. The circular shapes 302, 304, 306, and 308 are each equal in size and may each be sized 10 mils in diameter. Further, in the alternative, the circular shapes may range in diameter between about 8 mils and about 18 mils. The shapes may be differently sized or shaped.

The cross-sectional area of the via 300 is less than the area of a single circle (where its perimeter is indicated by dotted line 310) having a diameter approximately equal to an outside width of the via 300. The circle 310 represents the cross-sectional shape of a conventional drilled via. The diameter of each circular shape 302, 304, 306, and 308 is about half the diameter of the circle 310. As compared to the area of the circle 310, the cross-sectional area of the via 300 is about 18% less than the cross-sectional area of the circle 310. In addition, the length of the perimeter of the shape of the via 300 is about the same as the circumference of the circle 310. As a result of having reduced cross-sectional area compared to the conventional via-shaped circle 310, a power or ground plane electrically connected thereto may have a greater surface area, thereby reducing loss of power through the power or ground plane. Since the cross-section area is reduced in this example, the power loss through power and ground planes is improved. However, because the length of the perimeter of the shape of the via 300 is about the same as the circumference of the circle 310, the power loss through the vias is the same because the surface area, which is the via circumference multiplied by the via height, is the same.

Referring to FIG. 4, the cross-sectional shape of a via 400 is illustrated by the curved solid lines. The via 400 has a cross-sectional shape of two partially-overlapping circular shapes 402 and 404. Only a portion of each of the circular shapes 402 and 404 form the shape of the via 400 as indicated by the solid line of each circular shape. The broken lines of each shape 402 and 404 are not part of the shape of the via 400, and are meant to show the other portion of each circular shape for illustrative purposes only. The circular shapes 402 and 404 are each equal in size and may each be sized 10 mils in diameter. Further, in the alternative, the circular shapes may range in diameter between about 8 mils and about 18 mils. The shapes may be differently sized or shaped.

The cross-sectional area of the via 400 is less than the area of a single circle (where its perimeter is indicated by dotted line 406) having a diameter approximately equal to an outside width of the via 400. The circle 406 represents the cross-sectional shape of a conventional drilled via. The diameter of each circular shape 402 and 404 is about half the diameter of the circle 406. As compared to the area of the circle 406, the cross-sectional area of the via 400 is about 50% less than the cross-sectional area of the circle 406. In addition, the length of the perimeter of the shape of the via 400 is about 25% less than the circumference of the circle 406. As a result, signal integrity and power loss through the power and ground planes may be improved by use of this via due to the increase in the areas of the power and ground planes.

In accordance with embodiments of the present invention, the cross-sectional shape of a via may be comprised of multiple partially-overlapping shapes of any type. For example, the partially-overlapping shapes may be, but are not limited to, triangular, rectangular, square, polygonal, or rhomboidal shape. These shapes may be arranged such that three or more of the shapes overlap and such that each of the shapes partially overlaps with at least two of the other shapes. For example, these shapes of the same type, same size, different type, or different size may be arranged the same or similar to the circular shapes shown in any of FIGS. 2-4.

In another example, a variation to the examples of FIGS. 2-4 may be to overlap the shapes shown in FIGS. 2-4 with another shape that is centered at the center of the shapes shown in FIGS. 2-4. Portions of the edges of the centered shape may extend outside of the areas of the other shapes such that these portions do not overlap the other shapes. The centered shape may be circular, triangular, rectangular, square, polygonal, rhomboidal, or other shape. Also, the centered shape may be of the same type, same size, different type, and/or different size as any of the other overlapping shapes.

Figure 5:
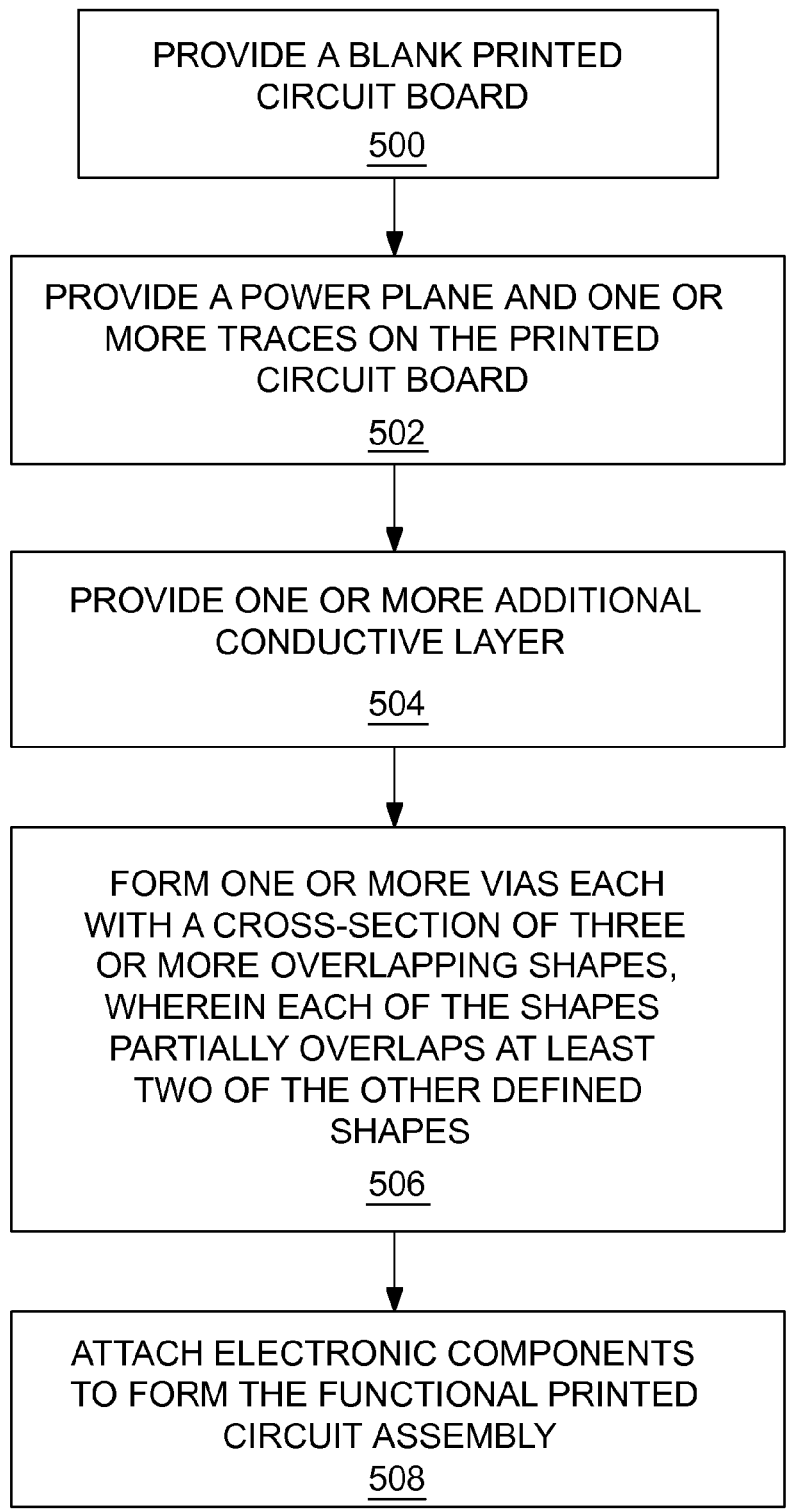
FIG. 5 sets forth a flow chart of an exemplary method for producing a microelectronic package having one or more vias in accordance with embodiments of the present invention.

As mentioned above, an exemplary method for producing a microelectronic package having one or more vias in accordance with embodiments of the present invention is described with reference to the FIG. 5, which sets forth a flow chart. It should be noted, in some alternative implementations, the functions noted in the blocks of the flow chart may occur out of the order noted in the figure. For example, two blocks shown in succession may, in fact, be executed substantially concurrently, or the blocks may sometimes be executed in the reverse order, depending upon the functionality involved. Referring to FIG. 5, the method includes providing 500 a blank printed circuit board. For example, the blank printed circuit board may include a copper layer over an entire surface of a substrate.

The method of FIG. 5 may also include providing 502 a power plane and one or more traces on the printed circuit board. For example, unwanted copper may be removed from the printed circuit board after applying a temporary mask (e.g., by etching), leaving only a desired power plane and traces. Exemplary techniques for removing copper include, but are not limited to, silk screen printing, photoengraving, and milling. Alternatively, the power plane and traces may be added by electroplating techniques or any other suitable additive technique. One or more layers may be added to the printed circuit board before providing the power plane. Alternatively, a ground plane may replace the power plane and may be provided at the first layer or any other layer of the printed circuit board.

The method of FIG. 5 includes providing 504 one or more additional conductive layers. For example, the additional layers may be added by bonding together separately etched thin board. These layers may include either a power plane or a ground plane and one or more traces.

The method of FIG. 5 includes forming 506 one or more vias each with a cross-section of three or more overlapping shapes. Each of the shapes partially overlaps at least two of the other shapes. For example, a via in accordance with embodiments of the present invention may be formed by drilling multiple, partially-overlapping holes or apertures through the printed circuit board to define an aperture between the conductive layers. For example, several holes may be drilled that define a single aperture and that correspond to the circular shapes of a cross-section of a via, such as the vias 200, 300, and 400 shown in FIGS. 2, 3, and 4, respectively. The aperture may be substantially filled with conductive material to electrically connect the conductive layers and to form an electrically-conductive via, such as the vias 200, 300, and 400 shown in FIGS. 2, 3, and 4, respectively. The partially-overlapping holes may be filled with a conductive material such as by a suitable plating technique.

The conductive material may be, for example, but not limited to, a conductive paste, silver epoxy, or low melt solder paste such as any indium alloy powders suspended in a flux. Alternatively, vias shaped in accordance with embodiments of the present invention may be suitably formed by laser techniques. The vias may be placed to electrically connect conductive components as described herein.

The method of FIG. 5 includes attaching 508 electronic components to form the functional printed circuit assembly. In through-hole construction, component leads may be inserted in holes. In surface-mount construction, the components may be placed on pads or lands on the outer surfaces of the printed circuit board. The component leads may be electrically and mechanically fixed to the board with a molten metal solder.

The resulting printed circuit board can be distributed by the fabricator in raw wafer form (that is, as a single wafer that has multiple unpackaged chips), as a bare die, or in a packaged form. In the latter case the printed circuit board may be mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with chips, discrete circuit elements, and/or other signal processing devices as part of either (a) an intermediate product, such as a motherboard, or (b) an end product. The end product can be any product that includes printed circuit boards, ranging from toys and other low-end applications to advanced computer products having a display, a keyboard or other input device, and a central processor.

In examples described herein, the power distribution systems relates to power distribution systems in package level designs. However, it should be understood that the systems and methods in accordance with embodiments of the present invention may also be applied to board level designs.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system comprising:
a power source including a terminal;
one of a power plane and a ground plane; and
a via filled with a conductive material that forms a conductive pathway that electrically connects the terminal of the power source to the one of the power plane and the ground plane, wherein the via has a cross-section of at least three partially-overlapping shapes, and wherein each of the shapes partially overlaps at least two of the other shapes.

2. The system of claim 1, wherein the shapes are each circular.

3. The system of claim 2, wherein the shapes have a diameter between about 8 mils and about 18 mils.

4. The system of claim 1, wherein the shapes are each one of triangular, rectangular, square, polygonal, and rhomboidal shape.

5. The system of claim 1, wherein at least two of the shapes are of different types.

6. The system of claim 1, wherein at least two of the shapes are of different sizes.

7. A system comprising:
a power source including a power supply voltage terminal and a power supply ground terminal;
a power plane;
a ground plane;
a first via filled with a conductive material that forms a first conductive pathway that electrically connects the power plane to the power supply voltage terminal of the power source, wherein the first via has a cross-section of at least partially-overlapping circular shapes, and wherein each one of the circular shapes partially overlaps at least two of the other circular shapes; and
a second via substantially filled with a conductive material that forms a second conductive pathway that electrically connects the ground plane to the power supply ground terminal of the power source, wherein the second via has a cross-section of at least three partially-overlapping circular shapes, and wherein each of the circular shapes partially overlaps at least two of the other circular shapes.

8. The system of claim 7, further comprising:
third and fourth conductive components for electrical connection to an electronic component; and
a third via electrically connecting the power plane and the third conductive component, wherein the third via has a cross-section of at least partially-overlapping circular shapes, and wherein each one of the circular shapes partially overlaps at least two of the other circular shapes; and
a fourth via electrically connecting the ground plane and the fourth conductive component, wherein the fourth via has a cross-section of at least three partially-overlapping circular shapes, and wherein each of the circular shapes partially overlaps at least two of the other circular shapes.

9. The system of claim 7, wherein the circular shapes have a diameter between about 8 mils and about 18 mils.

10. The system of claim 7, wherein at least two of the circular shapes are of different sizes.

* * * * *